United States Patent
Darolia et al.

(10) Patent No.: US 6,869,508 B2
(45) Date of Patent: Mar. 22, 2005

(54) PHYSICAL VAPOR DEPOSITION APPARATUS AND PROCESS

(75) Inventors: Ramgopal Darolia, West Chester, OH (US); Reed Roeder Corderman, Niskayua, NY (US); Joseph David Rigney, Milford, OH (US); Richard Arthur Nardi, Jr., Scotia, NY (US); Michael James Weimer, Loveland, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/063,808

(22) Filed: May 15, 2002

(65) Prior Publication Data

US 2003/0077403 A1 Apr. 24, 2003

Related U.S. Application Data

(60) Provisional application No. 60/343,791, filed on Oct. 19, 2001.

(51) Int. Cl.$^7$ .................... C23C 14/34; C23C 16/00; H05H 1/24
(52) U.S. Cl. .............. 204/192.11; 204/298.04; 204/298.15; 118/723 VE; 118/723 EB; 118/719; 118/726; 118/729; 427/576; 427/595; 427/596; 427/597; 427/248.1; 427/251; 427/255.5
(58) Field of Search ............... 204/192.11, 298.04, 204/298.06, 298.15, 298.23; 118/723 VE, 723 EB, 719, 726, 729; 427/576, 595, 596, 597, 248.1, 251, 255.5

(56) References Cited

U.S. PATENT DOCUMENTS

| | | | | |
|---|---|---|---|---|
| 5,296,274 A | * | 3/1994 | Movchan et al. | 427/566 |
| 5,975,852 A | | 11/1999 | Nagaraj et al. | 416/241 R |
| 6,042,898 A | * | 3/2000 | Burns et al. | 427/534 |
| 6,153,313 A | | 11/2000 | Rigney et al. | 428/632 |
| 6,174,571 B1 | * | 1/2001 | Corderman et al. | 427/585 |
| 6,255,001 B1 | | 7/2001 | Darolia | 428/610 |
| 6,291,084 B1 | | 9/2001 | Darolia et al. | 428/633 |

FOREIGN PATENT DOCUMENTS

| | | | | |
|---|---|---|---|---|
| JP | 05156438 | | 6/1993 | C23C/14/54 |
| JP | 06322521 | | 11/1994 | C23C/14/06 |

* cited by examiner

*Primary Examiner*—Steven VerSteeg
(74) *Attorney, Agent, or Firm*—David L. Narciso; Gary M. Hartman; Domenica N. S. Hartman

(57) ABSTRACT

A PVD process and apparatus (120) for depositing a coating (132) from multiple sources (110, 111) of different materials. The process and apparatus (120) are particulaity intended to deposit a beta-nickel aluminide coating (132) containing one or more elements whose vapor pressures are lower than NiAl. The PVD process and apparatus (120) entail feeding at least two materials (110, 111) into a coating chamber (122) and evaporating the materials (110, 111) at different rates from separate molten pools (114, 115) thereof. Articles (130) to be coated are suspended within the coating chamber (122), and transported with a support apparatus (118) relative to the two molten pools (114, 115) so as to deposit a coating (132) with a controlled composition that is a mixture of the first and second materials (110, 111).

34 Claims, 5 Drawing Sheets

PHYSICAL VAPOR DEPOSITION APPARATUS AND PROCESS

CROSS REFERENCE TO RELATED APPLICATIONS

This application claims the benefit of U.S. Provisional Application No. 60/343,791, filed Oct. 19, 2001.

BACKGROUND OF INVENTION

1. Field of the Invention

The present invention generally relates to coating apparatuses of the type used to deposit ceramic and metallic coatings. More particularly, this invention relates to a physical vapor deposition (PVD) apparatus and process for depositing a coating whose composition contains elements with relatively low and relatively high vapor pressures, such as a nickel aluminide alloyed with zirconium, hafnium, yttrium and/or cerium.

2. Description of the Related Art

Components within the turbine, combustor and augmentor sections of gas turbine engines are susceptible to oxidation and hot corrosion attack, in addition to high temperatures that can decrease their mechanical properties. Consequently, these components are often protected by an environmental coating alone or in combination with an outer thermal barrier coating (TBC), which in the latter case is termed a TBC system.

Diffusion coatings, such as diffusion aluminides and particularly platinum aluminides (PtAl), and overlay coatings, particularly MCrAlX alloys (where M is iron, cobalt and/or nickel, and X is an active element such as yttrium or another rare earth or reactive element), are widely used as environmental coatings for gas turbine engine components. Ceramic materials stick as zirconia ($ZrO_2$) partially or fully stabilized by yttria ($Y_2O_2$), magnesia (MgO) or other oxides, are widely used as TBC materials. Used in combination with TBC, diffusion aluminide and MCrAlX overlay coatings serve as a bond coat to adher, the TEC to the underlying substrate. The aluminum content of those bond coat materials provides for the slow growth of a strong adherent continuous aluminum oxide layer (alumina scale) at elevated temperatures. This thermally grown oxide (TGO) protects the bond coat from oxidation and hot corrosion, and chemically bonds the TBC to the bond coat.

Suitable processes for depositing MCrAlX coatings include thermal spraying such as plasma spraying and high velocity oxyfuel (HVOF) proceasca, and physical vapor deposition (PVD) processes such as eLectron beam physical vapor deposition (EBPVD), magnetron sputtering, cathodic arc, ion plasma, and pulsed laser deposinon (PLD). PVD processes require the presence of a coaling source material made essentially of the coating composition desired, and means for creating a vapor of the coating source material in the presence of a substrate that will accept the coating. FIG. 1 schematically represents a portion of an EBPVD coating apparatus 20, including a coating chamber 22 in which a component 30 is suspended for coating. An overlay coating 32 is represented as being deposited on the component 30 by melting and vaporizing an ingot 10 of the desired costing material with an electron beam 26 produced by an electron beam gun 28. The intensity of the beam 26 is sufficient to produce a stream 34 of vapor that condenses on the component 30 to form the overlay coating 32. As shown, the vapor stream 34 evaporates from a pool 14 of molten coating material contained within a reservoir formed by a wall 18 of a crucible 12 that surrounds the upper end of the ingot 10. Water or another suitable cooling medium flows through cooling passages 16 defined within the crucible 12 to maintain the crucible 12 at an acceptable temperature. As it is gradually consumed by the deposition process, the ingot 10 is incrementaily fed into the chamber 22 through an airlock 24.

More recently, overlay coatings (i.e., not a diffusion) of beta-phase nickel aluminide (β NiAl) intermetallic have been proposed as environmental and bond coat materials. The NiAl beta phase exists for nickel-aluminum compositions of about 30 to about 60 atomic percent aluminum, the balance of the nickel-aluminum composition being nickel. Notable examples of beta-phase NiAl coating materials include commonly-assigned U.S. Pat. No. 5,975,852 to Nagaraj et al., which discloses a NiAl overlay bond coat optionally containing one or more active elements, such as yttrium, cerium, zirconium or hafnium, and commonly-assigned U.S. Pat. No. 6,291,084 to Darolia et al., which discloses a NiAl overlay coating material containing chromium and zirconium. Commonly-assigned U.S. Pat. Nos. 6,153,313 and 6,255,001 to Rigney et al. and Darolia, respectively, also disclose beta-phase NiAl bond coat and environmental coating materials. The beta-phase NiAl alloy disclosed by Rigney et al. contains chromium, hafnium and/or titanium, and optionally tantalum, silicon, gallium, zirconium, calcium, iron and/or yttrium, while Darolia's beta-phase NiAl alloy contains zirconium. The beta-phase NiAl alloys of Nagaraj et al., Darolia et al., Rigney et al., and Darolia have been shown to improve the adhesion of a ceramic TBC layer, thereby increasing the service life of the TBC system.

MCrAlY-type coatings have been deposited using PVD and thermal spray processes interchangeably to achieve acceptable levels of environmental protection. Although no advantages have been found for either deposition technique in terms of environmental performance, PVD processes have often been preferred for producing smooth as-coated surface finishes and coating thickness uniformity. In contrast, beta-NiAl coatings have been found to exhibit significantly improved spallation resistance and environmental properties if deposited by a PVD process. However, difficulties have been encountered when attempting to deposit beta-NiAl coatings alloyed with zirconium, hafnium, yttrium, cerium and/or another reactive element, as required by the NiAl compositions of Nagaraj et al., Darolia et al., Rigney et al., and Darolia. For example, when attempting to evaporate an ingot of NiAl+Zr or NiAl+Cr+Zr, deposition rates are low and the chemistry of the coating has been difficult to control.

SUMMARY OF INVENTION

The PVD apparatus and process of this invention entail providing at lest two passages through which at lest two materials are fed into a coating chamber, and means for melting each of the materials to form molten pools thereof. A first of the materials has a composition with a higher vapor pressure than a second of the materials, and the melting means is operable to melt and evaporate the first and second materials at different rates. Finally, the apparatus includes means for suspending an article within the coating chamber. As a result of the presence of two separate molten pools, a nonhomogenous vapor cloud is present within the chamber, necessitating that the article is transported relative to the two molten pools in order to deposit a coating with a controlled composition that is a mixture of the materials.

The PVD apparatus and process of this invention entail providing at least two passages through which at least two materials are fed into a coating chamber, and means for melting each of the materials to form molten pools thereof. A first of the materials has a composition with a higher vapor pressure than a second of the materials, and the melting means is operable to melt and evaporate the first and second materials at different rates. Finally, the apparatus includes means for suspending an article within the coating chamber. As a result of the presence of two separate molten pools, a nonhomogeneous vapor cloud is present within the chamber, necessitating that the article is transported relative to the two molten pools in order to deposit a coating with a controlled composition that is a mixture of the materials.

The above coating process has been demonstrated by depositing beta-phase nickel aluminide coating materials containing zirconium by EBPVD and sputtering, though it is expected that the invention is also applicable to other PVD processes and to combinations of PVD and the use of gaseous sources of minor alloying elements. The demonstrated process produced coatings with controlled chemistries, and at deposition rates higher than possible if a single ingot containing NiAl and zirconium were evaporated.

Other objects and advantages of this invention will be better appreciated from the following detailed description.

DETAILED DESCRIPTION

Figure 1:
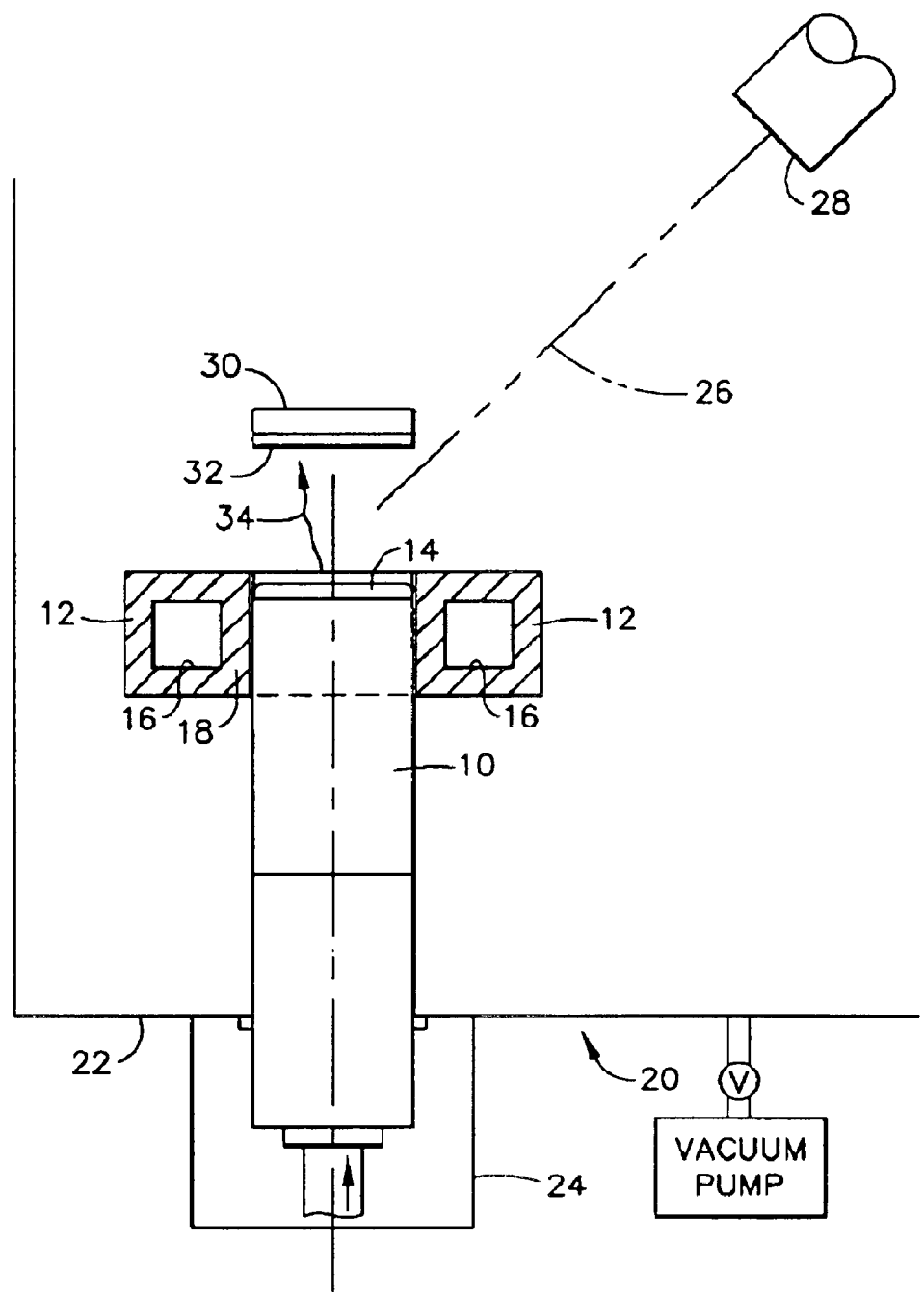
FIG. 1 shows a schematic representation of a portion of a prior art EBPVD apparatus used to deposit a coating of a nickel-base intermetallic material.
Figure 2:
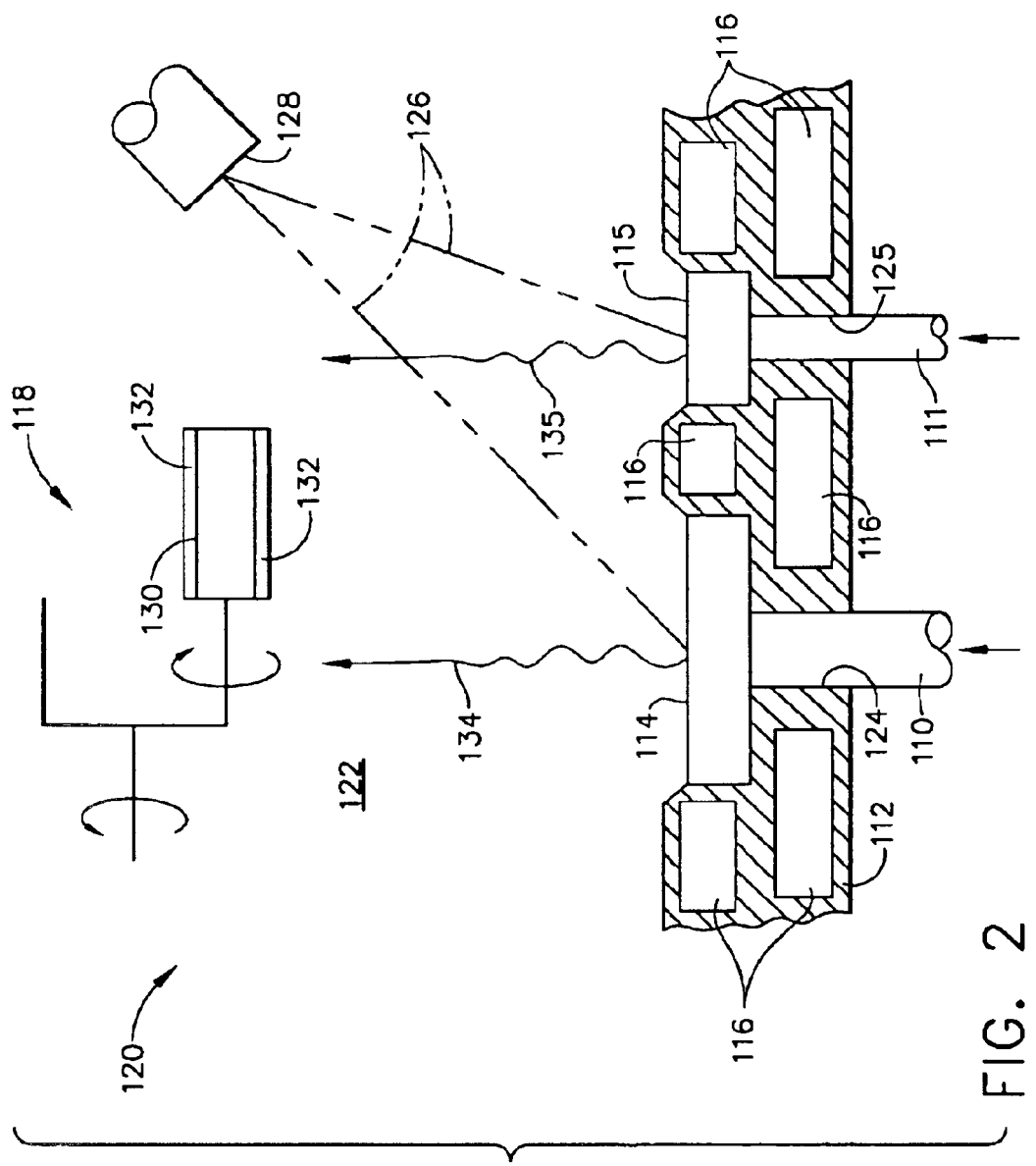
FIGS. 2, 3 and 4 are schematic representations of portions of EBPVD apparatuses according to two embodiments of this invention.
Figure 3:
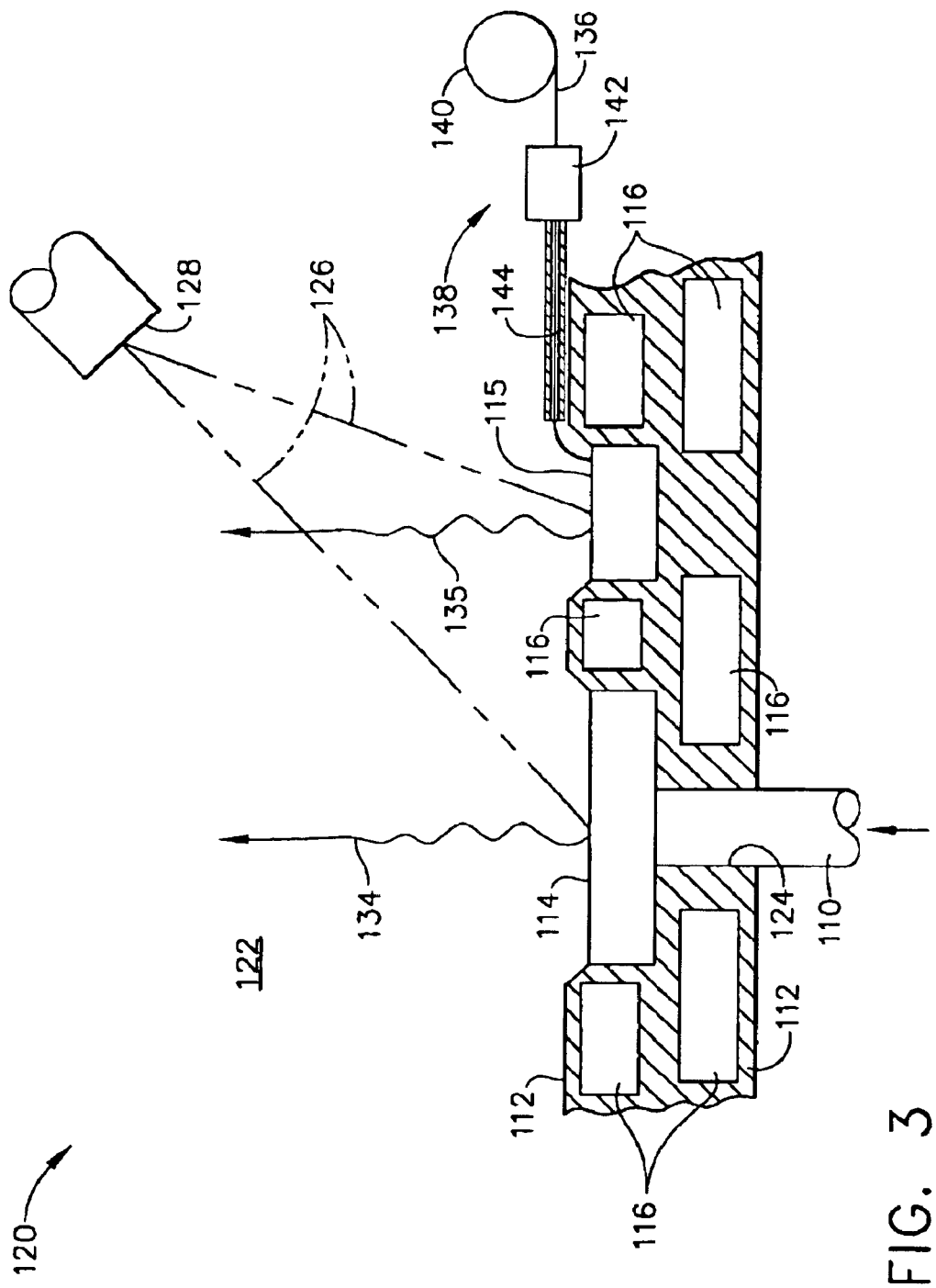
Figure 4:
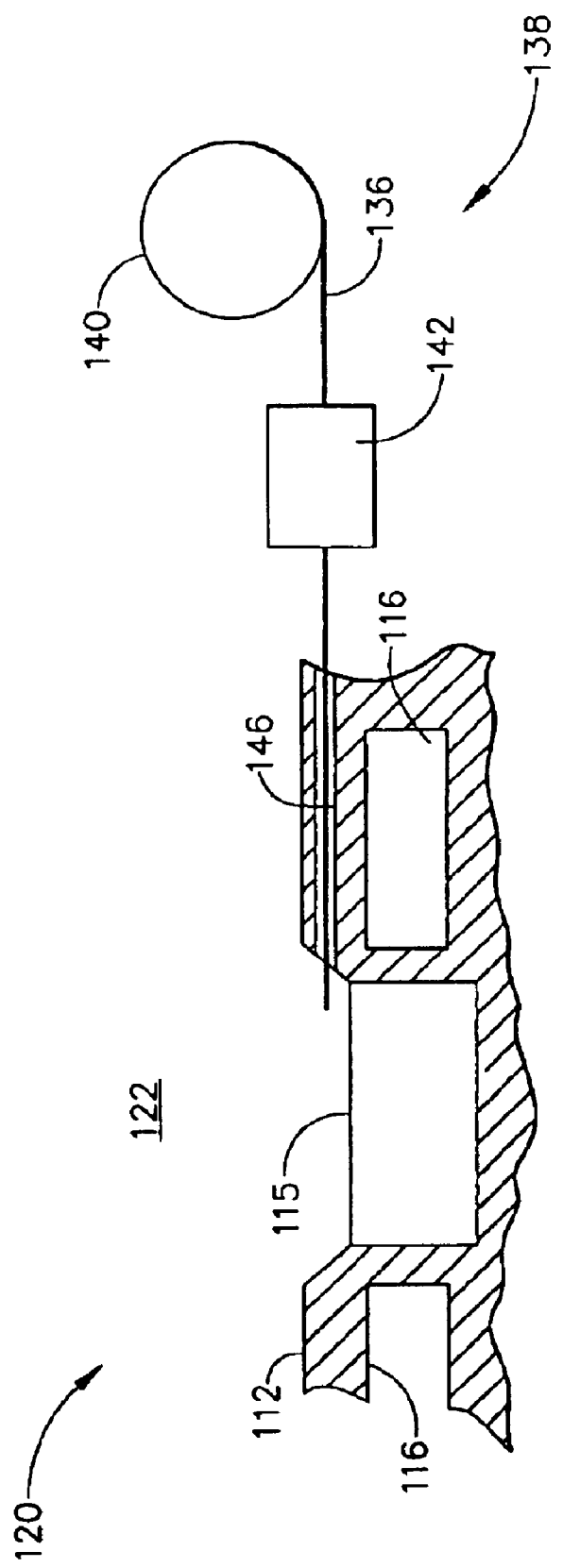

Three embodiments of a coating apparatus 120 are shown in FIGS. 2, 3 and 4 as being similar to the apparatus 20 of FIG. 1, and representative of a type suitable for depositing nickel-base intermetallic coatings. A particularly preferred coating material that can be deposited with the coating apparatus 120 is a beta-phase nickel aluminide, though it is also foreseeable that gamma-phase nickel intermetallics could be deposited.

In FIG. 2, the apparatus 120 is shown as comprising a crucible 112 through which a pair of ingots 110 and 111 are fed into a coating chamber 122, and an electron beam (EB) gun 128 generates an electron beam 126 that, in combination with a controlled beam jumping technique, melts the upper surfaces of both ingots 110 and 111 to produce separate molten pools 114 and 115 of the ingot materials within the crucible 112. With such a technique, the beam 126 is briefly projected (in the millisecond range) on each ingot 110 and 111, with the amount of time on each ingot 110 and 111 being adjusted so that the energy output achieves the energy balance required to obtain compositional control. As an alternative to the use of a single EB gun 128 shown in FIG. 2, two or more EB guns could be used to produce separate electron beams for maintaining both molten pools 114 and 115.

As with the apparatus 20 of FIG. 1, a component 130 is suspended within the coating chamber 122, so that an overlay coating 132 is deposited on the component 130 as a result of the melting and vaporizing of the ingots 110 and 111, which produces streams 134 and 135 of vapors that condense on the component 130. The component 130 is supported on planetary tooling 118 that transports the component 130 over both pools 114 and 115, so that the overlay coating 132 is a mixture of the ingot materials. As they are gradually consumed by the deposition process, the ingots 110 and 111 are incrementally fed into the chamber 122 through separate passages 124 and 125 in the crucible 112. As known in the art, water or another suitable cooling medium preferably flows through cooling passages 116 defined within the crucible 112 to maintain the crucible 112 at an acceptable temperature.

According to a preferred aspect of the invention, the compositions of the ingots 110 and 111 are chosen so that the coating 132 is a beta-phase NiAl intermetallic material. Notable examples of NiAl-based materials are those disclosed in Nagaraj et al., Rigney et al., Darolia, and Darolia et al., discussed previously, which are formulated as environmental coatings and bond coats for gas turbine engine applications. These NiAl-based coatings preferably contain about 20 to 32 weight percent (about 35–50 atomic percent) aluminum to achieve the beta phase, and may contain one or more of chromium, hafnium, titanium, tantalum, silicon, gallium, zirconium, calcium, iron, cerium and/or yttrium. These alloying ingredients have different vapor pressures than beta-NiAl, which this invention has determined leads to limited deposition rates and difficulties in achieving controlled chemistries for the coating 132.

With the present invention, those alloying ingredients with significantly lower vapor pressures, most notably zirconium, hafnium, yttrium and cerium (or another reactive element), are provided in one of the ingots (e.g., 111), while those with higher vapor pressures, such as NiAl and chromium (if desired in the coating 132), are present in the other ingot (e.g., 110). The electron beam 126 is then used to melt and vaporize the ingots 110 and 111 at controlled but different rates to produce a coating 132 with a predictable chemistry. In particular, the power of the beam 126 is jumped to an appropriate level to optimize the melting and vaporizing rates of the particular ingot material on which it is projected, so that the overall deposition rate can be increased and the uniformity of the coating chemistry improved. The power level inputs to the pools 114 and 115 are adjusted based in part on the coating chemistry, in addition to the relative sizes of the pools 114 and 115. For ingots 110 and 111 of the same diameter, the required power level is lower for an ingot of zirconium and other reactive elements as compared to the NiAl ingot. Because of the different melting and vaporizing rates, the ingots 110 and 111 are fed into the chamber 122 at different rates as they are gradually consumed by the deposition process. As an example of the above, deposition of an NiCrAl overlay coating containing about 1 weight percent zirconium has been performed using separate ingots (110 and 111) of beta-phase NiAl+Cr and Zr, in which the molten pool size of the zirconium ingot is maintained to have a surface area of nearly fifty percent smaller than the pool size of the NiAl+Cr ingot. A lower power level input is able to maintain the molten zirconium pool because of its smaller size as well as the lower vapor pressure of zirconium compared to NiAl and chromium.

While only two ingots 110 and 111 are shown in FIG. 2, it is foreseeable that multiple crucibles with multiple ingots of each type of material could be employed to increase the size of the coating zone within the chamber 122. Also foreseeable is the use of ingots containing multiple constituents of the coating 132 (e.g., nickel, aluminum and chromium) that are present in separate regions of the ingot. Another alternative is to use a separate ingot for each of the elements desired for the coating 132. For example, for a coating 132 of NiAl alloyed with chromium and zirconium, four separate nickel, aluminum, chromium and zirconium ingots could be used, each compositionally homogeneous and each individually melted to produce single-element pools that are co-evaporated. Again, the power levels of the electron beam used to evaporate the individual ingots would be controlled to optimize evaporation rates and promote the ability to obtain the desired chemistry for the coating 132.

In each of the different embodiments discussed above, the chemistry of the vapor cloud resulting from the vapor streams 134 and 135 will be quite different from one location to another within the cloud. Therefore, and particularly if multiple components or surfaces are to be coated at a single time, the location of the surfaces being coated within the vapor cloud will effect the coating chemistry. Therefore, the planetary tooling 118 shown in FIG. 2 is preferably employed to achieve more uniform chemistry control by transporting the component 130 above both pools 114 and 115, so that the component 130 passes through those regions of the vapor cloud with different chemistries.

The embodiment of FIG. 3 differs by modifying the crucible 112 to feed a wire 136 of the lower vapor pressure material into the chamber 122, instead of the ingot 111. The wire 136 is shown as being dispensed with a feed system 138 that includes a spool 140 from which the wire 136 is pulled by a wire feed device 142, which feeds the wire 136 through a guide 144 to the molten pool 115. Alternatively, the wire 136 could be fed by the wire feed device 142 through a passage 146 defined within the upper surface of the crucible 112, as shown in FIG. 4. Other than appropriately modifying the control of the EB gun 128 to achieve a desired evaporation rate, the embodiments of FIGS. 3 and 4 are similar to that of FIG. 2. An advantage of feeding a smaller diameter wire is the capability of a more accurate measurement of the higher volume feed rate made possible with this invention, as compared to the accuracy possible with an ingot that is larger in diameter, and therefore requires lower and more accurate linear feed rates as compared to a wire to achieve the same volume feed rate.

Various modifications could be made to the physical vapor deposition processes described above, including the use of one or more laser beams instead of the electron beams 126 to melt the ingots 110 and 111 or wire 136. Other physical vapor deposition techniques could also be used, including magnetron sputtering, cathodic arc, ion plasma, pulsed laser deposition (PLD), and combinations thereof. Particular combinations of PVD techniques include EBPVD with cathodic arc, EBPVD with ion plasma, EBPVD with sputtering, EBPVD with PLD, sputtering with PLD, and cathodic arc with PLD. In addition, a PVD technique could be combined with the use of a gaseous source of a minor alloying element, such as the reactive element (zirconium, hafnium, yttrium and/or cerium).

In an investigation leading to this invention, beta-phase NiAl-based based coatings were deposited onto six sets of buttons made from the single-crystal superalloy known as René N5. The targeted composition for the coatings was, in atomic percent, about 40 to 48% aluminum, about 5% chromium, and about 0.1 to 1.2% zirconium. The EBPVD process used to deposit the coatings used an ingot of NiAlCr that was continuously melted and evaporated by one electron beam, while an ingot of zirconium was continuously melted and evaporated by a second electron beam. In this manner, ingot chemistry was used to obtain the relative desired levels of nickel, aluminum and chromiun, while the electron beam parameters were adjusted to vary the zirconium content from one button set to another. During the coating process, the buttons were transported through the vapor cloud in a manner similar to that represented in FIG. 2. The coatings were deposited to a thickness of about 2 mils (about 50 micrometers), after which the costed buttons were subjected to a vacuum diffusion heat treatment at about 1975° F. (about 1080° C.) for about two hours.

Figure 5:
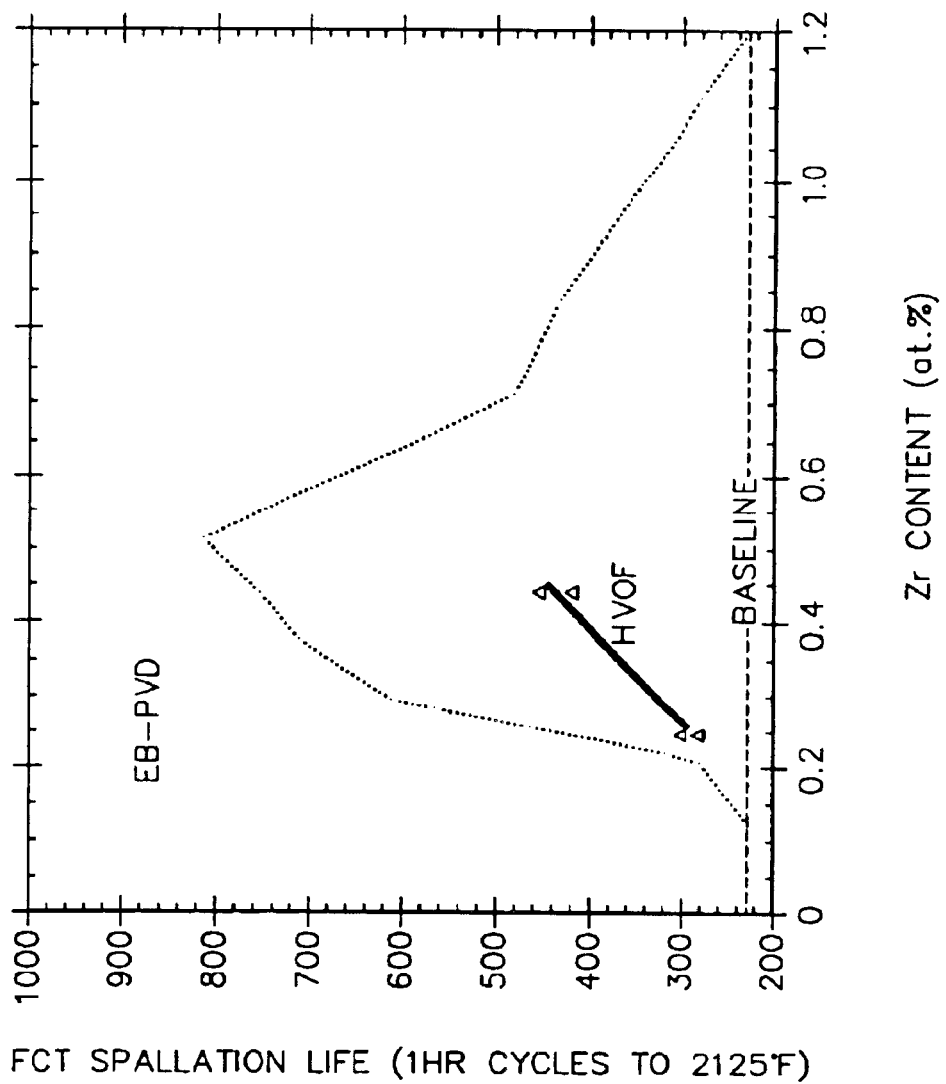
FIG. 5 is a graph comparing the performance potentials for coatings deposited by the EBPVD process of this invention with coatings deposited by a thermal spraying process.

All of the buttons were then coated by EBPVD with about 5 mils (about 125 micrometers) of a thermal barrier coating (TBC) of 7%YSZ (zirconia stabilized by about 7 weight percent yttria), such that the NiAlCr+Zr coatings served as bond coats for the TBC. The spallation life potentials of the TBC coatings were then evaluated by furnace cycle testing (FCT) at a maximum temperature of about 2125° F. (about 1160° C.) using one-hour cycles. The results of the experiments are plotted in FIG. 5. In addition to evidencing that FCT performance was strongly influenced by zirconium concentration, the plotted data show that the performance potentials for those coatings deposited by the PVD process of this invention were clearly superior those thermal sprayed coatings having the same bond coat chemistry.

In addition to achieving greater FCT performance as compared to coatings deposited by HVOF, the coating process of this invention was found to proceed more rapidly than when a single ingot containing the same composition desired for the coatings was evaporated with a single electron beam, essentially as depicted in FIG. 1. Although the above results were obtained with NiAl-based coatings deposited by EBPVD, it is believed that similar results can also be achieved by depositing NiAl-based coatings by magnetron sputtering, as will as one or more of the other PVD processes noted above. Finally, it is believed that similar results would be obtained by intermittently (instead of continuously) melting the zirconium ingot with an electron beam, as discussed above.

While the invention has been described in terms of a preferred embodiment, it is apparent that modifications could be adopted by one skilled in the art. Accordingly, the scope of the invention is to be limited only by the following claims.

What is claimed is:

1. A physical vapor deposition apparatus comprising:
 a coating chamber;
 means for providing at least two passages through which at least two materials are fed into the coating chamber, at least a first of the materials having a composition with a higher vapor pressure than a second of the materials,
 means for melting the first and second materials to form molten pools thereof, the melting means operating to deliver different power level inputs to the last and second materials so as to melt the first and second materials at different rates; and
 means for suspending an article within the coating chamber, the suspending means transporting the article within the coating chamber relative to the two molten pools so as to deposit a coating on the article with a controlled composition that is a mixture of the first and second materials.

2. A physical vapor deposition apparatus according to claim 1, wherein the providing means is a crucible in which the two passages are defined.

3. A physical vapor deposition apparatus according to claim 1, wherein the melting means comprises an electron beam or a laser beam.

4. A physical vapor deposition apparatus according to claim 1, wherein the melting means is a single electron beam that is sequentially projected on each of the first and second materials.

5. A physical vapor deposition apparatus according to claim 1, wherein the melting means projects a first electron beam on the first material and a second electron beam on the second material.

6. A physical vapor deposition apparatus according to claim 1, where the two materials are in the form of ingots.

7. A physical vapor deposition apparatus according to claim 1, wherein the first material is in the form of an ingot and the second material is in the form of a wire.

8. A physical vapor deposition apparatus according to claim 1, wherein the first material comprises beta-NiAl.

9. A physical vapor deposition apparatus according to claim 3, wherein the first material further comprises at least one element chosen from the group consisting of chromium, titanium, tantalum, silicon, gallium, calcium and iron.

10. A physical vapor deposition apparatus according to claim 8, wherein the first material further comprises chromium.

11. A physical vapor deposition apparatus according to claim 8, wherein the second material is chosen from the group consisting of zirconium, hafnium, yttrium and cerium.

12. A physical vapor deposition apparatus according to claim 1, wherein the second material is chosen from the group consisting of zirconium, hafnium, yttrium and coruim.

13. An electron beam physical vapor deposition apparatus comprising:
a coating chamber,
a crucible having at least two passages through which at least two materials are fed into the coating chamber, a first of the two materials being an ingot of a beta-NiAl alloy containing chromium, a second of the two materials comprising at least one element chosen from the group consisting of zirconium, hafnium, yttrium and cerium, such that the first material has a higher vapor pressure than the second material;
means for generating at least one electron beam for melting the first and second materials to form molten pools thereof, the generating means operating to deliver different power level inputs to the first and second materials so as to melt the first and second materials at different rates; and
means for suspending an article within the coating chamber, the suspending means transporting the article within the coating chamber relative to the two molten pools so as to deposit a coating on the article with a controlled composition that is a mixture of the first and second materials.

14. A physical vapor deposition apparatus according to claim 13, wherein the generating means generates a single electron beam that is sequentially projected on each of the first and second materials.

15. A physical vapor deposition apparatus according to claim 13, wherein the generating means projects a first electron beam on the first material and a second electron beam on the second material.

16. A physical vapor deposition apparatus according to claim 13, wherein the second material is in the form of an ingot.

17. A physical vapor deposition apparatus according to claim 13, wherein the second material is in the form of a wire.

18. A physical vapor deposition process comprising the steps of:
providing at least two passages through which at least two materials are fed into a coating chamber of a physical vapor deposition apparatus, at least a first of the materials having a composition with a higher vapor pressure than a second of the materials;
melting the first and second materials to form molten pools thereof, the first and second materials being melted by means delivering different power level inputs to the first and second materials so as to melt the first and second materials at different rates; and
suspending an article within the coating chamber and transporting the article relative to the two molten pools so as to deposit a coating oil the article with a controlled composition that is a mixture of the first and second materials.

19. A physical vapor deposition process according to claim 18, wherein the two passages are defined by a crucible.

20. A physical vapor deposition process according to claim 18, wherein the first and second materials are melted with an electron beam or a laser beam.

21. A physical vapor deposition process according to claim 18, wherein the first and second materials are melted with a single electron beam that is sequentially projected on each of the first and second materials.

22. A physical vapor deposition process according to claim 18, wherein the first and second materials are melted by a first electron beam projected on the first materials and a second electron beam projected on the second material.

23. A physical vapor deposition process according to claim 18, wherein the two materials are in the form of ingots.

24. A physical vapor deposition process according to claim 18, wherein the first material is in the form of an ingot and the second material is in the form of a wire.

25. A physical vapor deposition process according to claim 18, wherein the first material comprises beta-NiAl.

26. A physical vapor deposition process according to claim 25, wherein the first material further comprises at least one element chosen from the group consisting of chromium, titaninm, tantalum, silicon, gallium, calcium and iron.

27. A physical vapor deposition process according to claim 25, wherein the first material further comprises chromium.

28. A physical vapor deposition process according to claim 25, wherein the second material is chosen from the group consisting of zirconium, hafniunm, yttrium and cerium.

29. A physical vapor deposition process according to claim 18, wherein the second material is chosen from the group consisting of zircomium, hafnium, yttrium and cerium.

30. An electron beam physical vapor deposition process comprising the steps of:
providing a crucible having at least two passages through which at least two materials are fed into a coating chamber, a first of the two materials being an ingot of a beta-NiAl alloy containing chromium, a second of the two materials comprising at least one element chosen from the group consisting of zirconium, hafnuium, yttrium and cerium, such that the first material has a higher vapor pressure than the second material;
generating at least one electron beam to melt the first and second materials and form molten pools thereof, the at least one electron beam delivering different power level inputs to the first and second materials so as to melt the first and second materials at different rates; and suspending an article within the coating chamber and transporting the article relative to the two molten pools so as to deposit a coating on the article with a controlled composition that is a mixture of the first and second materials.

31. An electron beam physical vapor deposition process according to claim 30, wherein the generating step generates a single electron beam that is sequentially projected on each of the first and second materials.

32. An electron beam physical vapor deposition process according to claim 30, wherein in the generating step projects a first electron beam on the first material and a second electron beam an the second material.

33. An electron beam physical vapor deposition process according to claim 30, wherein the second material is in the form of an ingot.

34. An electron beam physical vapor deposition process according to claim 30, wherein the second material is in the form of a wire.

* * * * *